United States Patent
Takeda et al.

(10) Patent No.: US 7,582,541 B2
(45) Date of Patent: Sep. 1, 2009

(54) WAFER LASER PROCESSING METHOD

(75) Inventors: Noboru Takeda, Tokyo (JP); Yukio Morishige, Tokyo (JP)

(73) Assignee: Disco Corporation, Tokyo (JP)

( * ) Notice: Subject to any disclaimer, the term of this patent is extended or adjusted under 35 U.S.C. 154(b) by 311 days.

(21) Appl. No.: 11/797,627

(22) Filed: May 4, 2007

(65) Prior Publication Data

US 2007/0264799 A1 Nov. 15, 2007

(30) Foreign Application Priority Data

May 9, 2006 (JP) .............................. 2006-129967

(51) Int. Cl.
*H01L 21/00* (2006.01)
(52) U.S. Cl. ...................... 438/463; 438/462; 438/487; 438/535
(58) Field of Classification Search ................. 438/462, 438/463, 487, 535, 662; 250/559.13; 219/121.6
See application file for complete search history.

(56) References Cited

U.S. PATENT DOCUMENTS 6,130,401 A 10/2000 Yoo et al.
7,388,172 B2 * 6/2008 Sercel et al. ........... 219/121.72
7,399,682 B2 * 7/2008 Yoshikawa et al. .......... 438/463

FOREIGN PATENT DOCUMENTS

JP 2000-156358 6/2000

* cited by examiner

*Primary Examiner*—Leonardo Andújar
*Assistant Examiner*—Monica D Harrison
(74) *Attorney, Agent, or Firm*—Smith, Gambrell & Russell, LLP

(57) ABSTRACT

A wafer laser processing method for forming a groove along streets in a wafer by moving the wafer at a predetermined feed rate while a laser beam whose focal spot is elliptic is applied along the streets formed on the wafer, comprising: a groove forming step for forming a groove along the streets by applying a first laser beam whose elliptic focal spot has a ratio of the long axis to the short axis of 30 to 60:1, along the streets formed on the wafer; and a debris removing step for removing debris accumulated in the groove by applying a second laser beam whose elliptic focal spot has a ratio of the long axis to the short axis of 1 to 20:1, along the groove formed by the groove forming step; the groove forming step and the debris removing step being repeated alternately.

2 Claims, 11 Drawing Sheets

(a)

(b)

(c)

(a)

(b)

(c)

WAFER LASER PROCESSING METHOD

FIELD OF THE INVENTION

The present invention relates to a wafer laser processing method for forming a groove in a wafer such as an optical device wafer or the like.

DESCRIPTION OF THE PRIOR ART

In the production process of a semiconductor device, a plurality of areas are sectioned by dividing lines called "streets" arranged in a lattice pattern on the front surface of a substantially disk-like silicon substrate, and a device such as IC or LSI is formed in each of the sectioned areas. Individual semiconductor chips are manufactured by cutting this semiconductor wafer along the streets to divide it into the areas having a device formed therein. An optical device wafer having light receiving elements such as photodiodes or light emitting elements such as laser diodes laminated on the front surface of a sapphire or silicon carbide substrate is also cut along streets to be divided into individual optical devices such as photodiodes or laser diodes which are widely used in electric appliances.

Although the wafer can be easily cut from the silicon substrate into individual chips by a cutting machine, it is difficult to cut a wafer comprising a substrate made of a material hard to cut such as sapphire, silicon carbide, gallium arsenide or lithium tantalate by the cutting machine. As a means of dividing a wafer comprising a substrate made of the above materials hard to cut, along streets, JP-A 2000-156358 discloses a method in which a groove is formed by applying a pulse laser beam of a wavelength having absorptively for the wafer along the streets formed on the wafer and the wafer is divided along the grooves.

In the method in which the laser beam is applied along the streets formed on the wafer, however, there arises a problem in that when a groove is formed by applying a laser beam to a wafer having a thickness of 300 μm or more, scattered debris accumulates in the grooves to prevent processing by means of the laser beam. According to experiments conducted by the inventors of the present invention, when a pulse laser beam was applied along the streets of a wafer having a thickness of 350 μm 400 times under the conditions of a wavelength of 355 nm, a repetition frequency of 10 kHm, an average output of 7 W and a long axis (D1) of the focal spot of 100 μm, a short axis (D2) of 10 μm and a processing-feed rate of 50 mm/sec, a groove having a depth required for division could not be formed.

SUMMARY OF THE INVENTION

It is an object of the present invention to provide a wafer laser processing method capable of forming a groove having a depth required for division even when the thickness of the wafer is 300 μm or more.

To attain the above object, according to the present invention, there is provided a wafer laser processing method for forming a groove along streets in a wafer by moving the wafer at a predetermined processing-feed rate while a laser beam whose focal spot is elliptic is applied along the streets formed on the wafer, comprising:

a groove forming step for forming a groove along the streets by applying a first laser beam whose elliptic focal spot has a ratio of the long axis to the short axis of 30 to 60:1, along the streets formed on the wafer; and a debris removing step for removing debris accumulated in the groove by applying a second laser beam whose elliptic focal spot has a ratio of the long axis to the short axis of 1 to 20:1, along the groove formed by the groove forming step; the groove forming step and the debris removing step being repeated alternately.

The long axis of the elliptic focal spot of the first laser beam is set to 300 to 600 μm, and the long axis of the elliptic focal spot of the second laser beam is set to 10 to 200 μm.

In the present invention, the groove forming step is carried out with the first laser beam whose elliptic focal spot has a ratio of the long axis to the short axis of 30 to 60:1 suitable for the formation of a groove, the debris removing step is carried out with the second laser beam whose elliptic focal spot has a ratio of the long axis to the short axis of 1 to 20:1, and the groove forming step and the debris removing step are repeated alternately. Therefore, even when the wafer is thick, a groove having a required depth can be formed without being influenced by the debris.

DETAILED DESCRIPTION OF THE PREFERRED EMBODIMENTS

Preferred embodiments of the present invention will be described in detail hereinunder with reference to the accompanying drawings.

Figure 1:
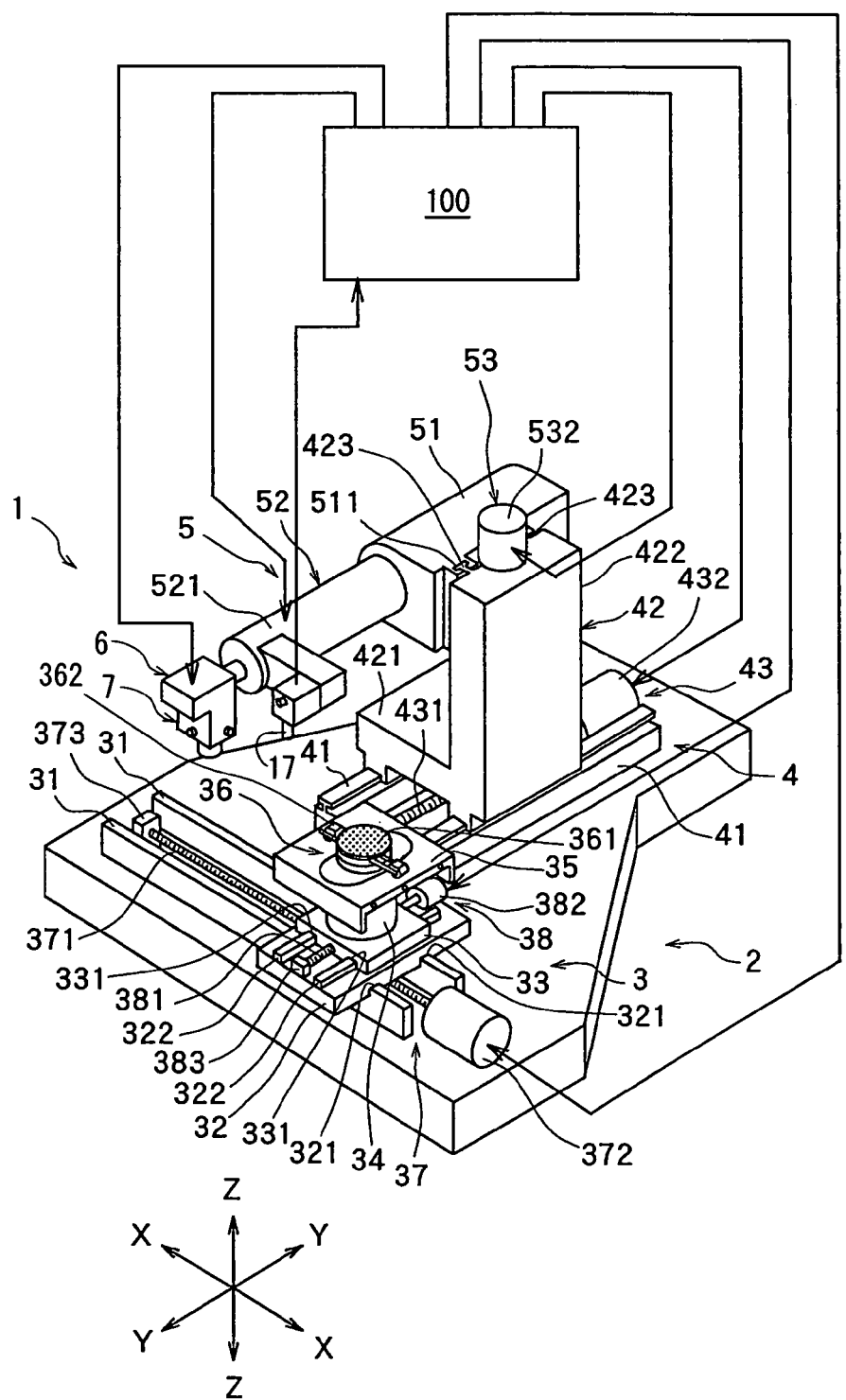
FIG. 1 is a perspective view of a laser beam processing machine for carrying out the wafer laser processing method of the present invention.

FIG. 1 is a perspective view of a laser beam processing machine for carrying out the wafer laser processing method according to the present invention. The laser beam processing machine 1 shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31 which are mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a cover table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer is held on the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame which will be described later.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 that is arranged between the above pair of guide rails 31 and 31 parallel thereto, and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the to-be-guided grooves 331 and 331 to the pair of guide rails 322 and 322, respectively. The chuck table mechanism 3 in the illustrated embodiment comprises a first indexing-feed means 38 for moving the second sliding block 33 along the pair of guide rails 322 and 322 provided on the first sliding block 32 in the indexing-feed direction indicated by the arrow Y. The first indexing-feed means 38 has a male screw rod 381 which is arranged between the above pair of guide rails 322 and 322 parallel thereto, and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 comprises a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing-feed means 43 has a male screw rod 431 that is arranged between the above pair of guide rails 41 and 41 parallel thereto, and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the guide grooves 511 and 511 to the above guide rails 423 and 423, respectively.

The laser beam application unit 5 in the illustrated embodiment comprises a moving means 53 for moving the unit holder 51 along the pair of guide rails 423 and 423 in the direction indicated by the arrow Z. The moving means 53 comprises a male screw rod (not shown) arranged between the above pair of guide rails 423 and 423 and a drive source such as a pulse motor 532 for rotary driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z. In the illustrated embodiment, the laser beam application means 52 is designed to be moved up by driving the pulse motor 532 in a normal direction and to be moved down by driving the pulse motor 532 in the reverse direction.

Figure 2:
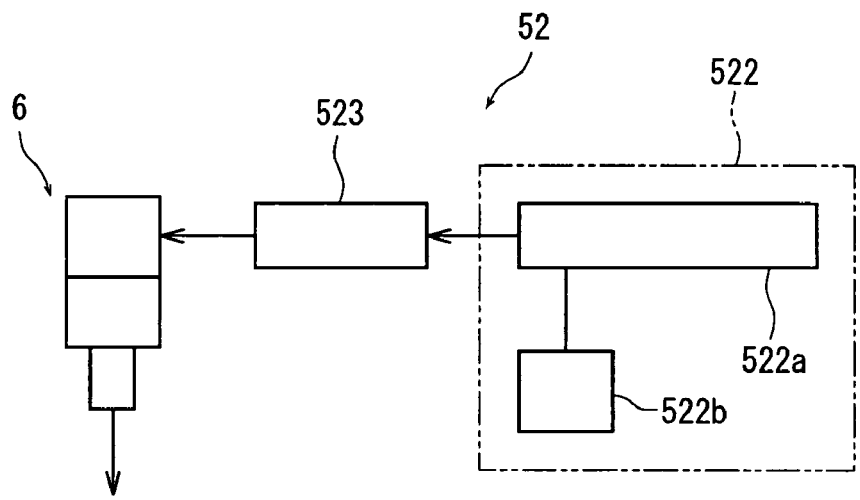
FIG. 2 is a constitutional block diagram of a laser beam application means provided in the laser beam processing machine shown in FIG. 1.

The illustrated laser beam application means 52 has a cylindrical casing 521 which is secured to the above unit holder 51 and extends substantially horizontally. The laser beam application means 52 comprises a pulse laser beam oscillation means 522 and a transmission optical system 523 installed in the casing 521 as shown in FIG. 2 and a processing head 6 for applying a pulse laser beam oscillated by the pulse laser beam oscillation means 522 to the workpiece held on the above chuck table 36, which is attached to the end of the casing 521. The above pulse laser beam oscillation means 522 comprises a pulse laser beam oscillator 522a composed of a YAG laser oscillator or YVO4 laser oscillator and a repetition frequency setting means 522b connected to the pulse laser beam oscillator 522a. The transmission optical system 523 comprises suitable optical elements such as a beam splitter, etc.

Figure 3:
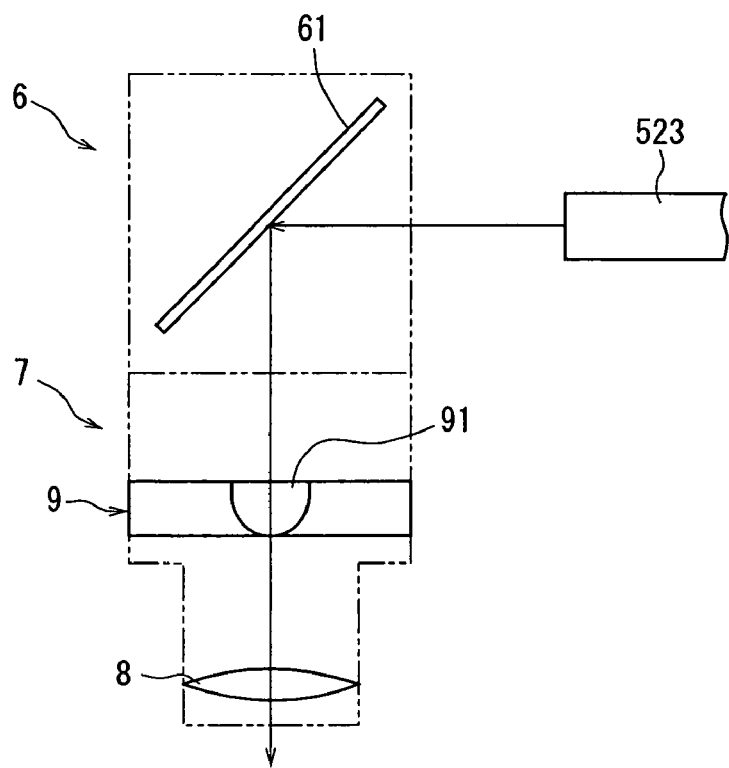
FIG. 3 is an explanatory diagram showing a processing head comprising a condenser constituting the laser beam application means shown in FIG. 2.
Figure 4:
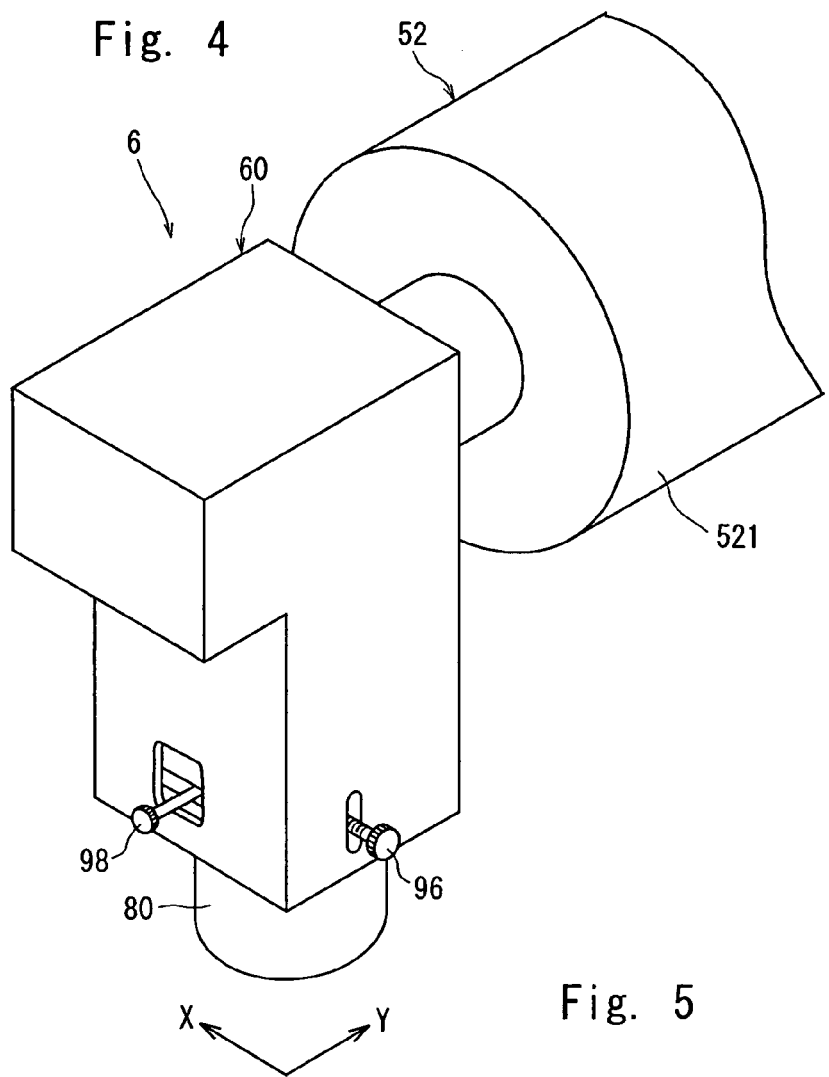
FIG. 4 is a perspective view of the processing head shown in FIG. 3.

The above processing head 6 comprises a direction changing mirror 61 and a condenser 7 as shown in FIG. 3. The direction changing mirror 61 changes the direction of the pulse laser beam that is oscillated from the above pulse laser beam oscillation means 522 and irradiated through the transmission optical system 523, toward the condenser 7. The condenser 7 in the illustrated embodiment comprises a condenser lens 8 opposed to the workpiece held on the above chuck table 36, a cylindrical lens unit 9 arranged on the upstream side in the laser beam application direction of the condenser lens 8, that is, between the condenser lens 8 and the direction changing mirror 61, and an interval adjusting mechanism for adjusting the interval between the condenser lens 8 and the cylindrical lens unit 9, which will be described later. The above direction changing mirror 61, the cylindrical lens unit 9 and the interval adjusting mechanism later described are installed in a processing head housing 60 mounted onto the end of the above casing 521 as shown in FIG. 4. The above condenser lens 8 is installed in a lens housing 80 attached to the bottom of the processing head housing 60. The focal distance of the condenser lens 8 is set to 40 mm in the illustrated embodiment.

Figure 5:
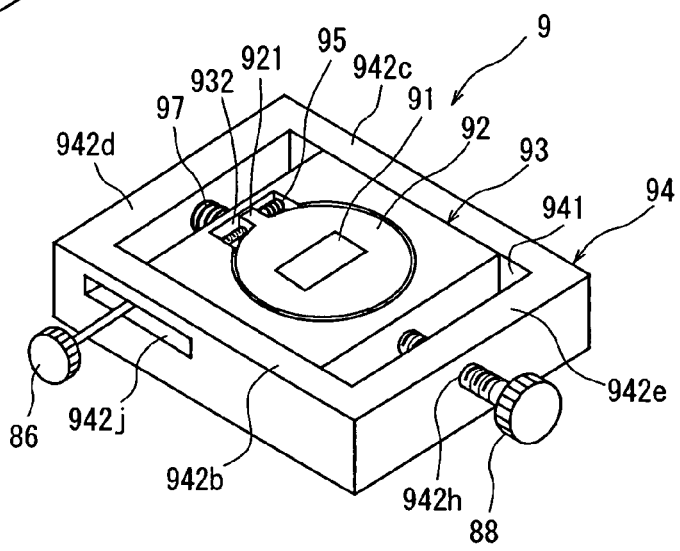
FIG. 5 is a perspective view of a cylindrical lens unit constituting the condenser of the processing head shown in FIG. 3.

A description will be subsequently given of the above cylindrical lens unit 9 with reference to FIGS. 5 to 7. FIG. 5 is a perspective view of the cylindrical lens unit 9 and FIG. 6 is an exploded perspective view of the cylindrical lens unit 9 shown in FIG. 5.

Figure 6:
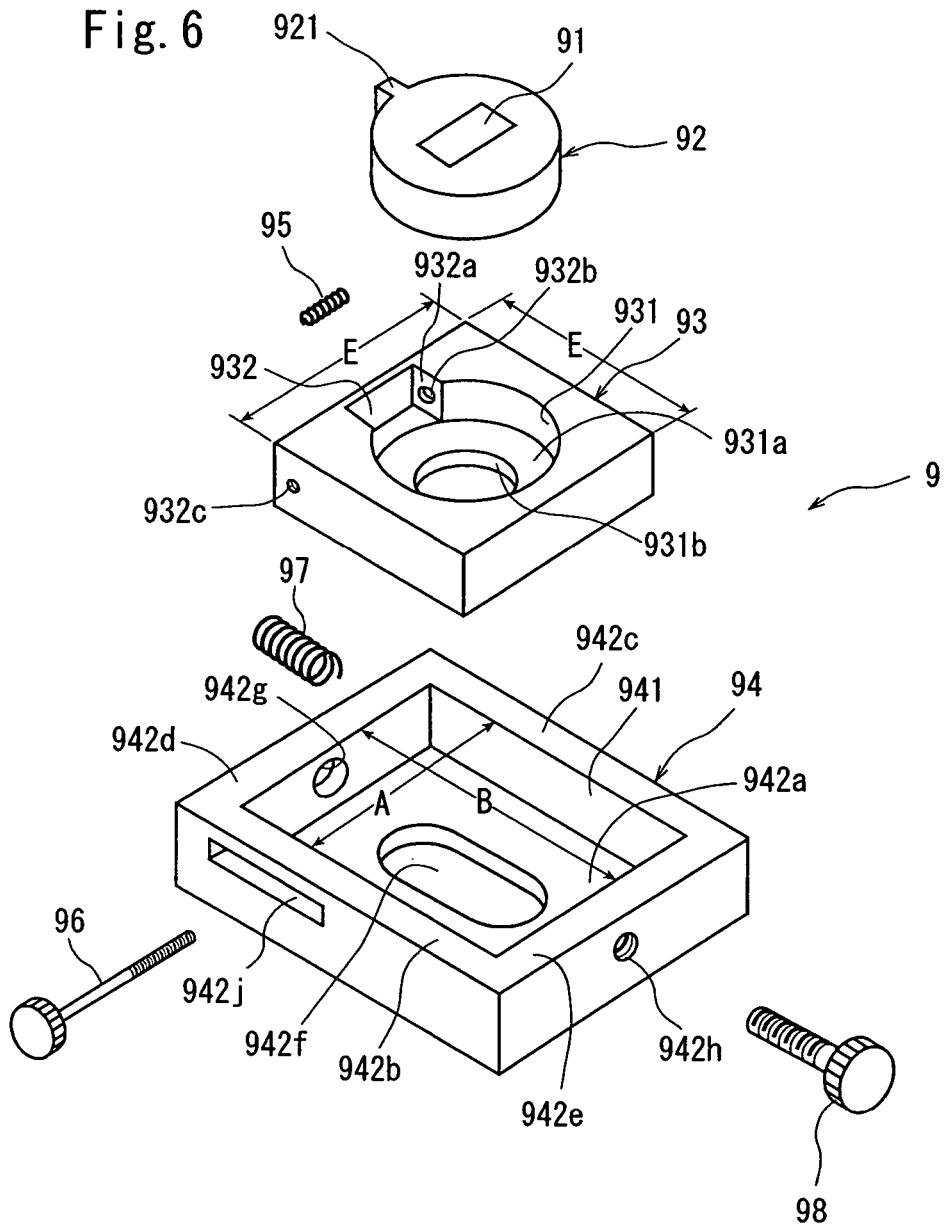
FIG. 6 is an exploded perspective view of constituent members of the cylindrical lens unit shown in FIG. 5.

The cylindrical lens unit 9 shown in FIG. 5 and FIG. 6 comprises a cylindrical lens 91, a lens holding member 92 for holding the cylindrical lens 91, a first frame 93 for holding the lens holding member 92 and a second frame 94 for holding the first frame 93.

Figure 7:
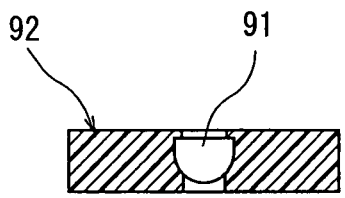
FIG. 7 is a sectional view of a lens holding member holding a cylindrical lens constituting the cylindrical lens unit shown in FIG. 5.

The cylindrical lens 91 is a convex lens having a semicircular section as shown in FIG. 7. The focal distance of this cylindrical lens 91 is set to 40 mm in the illustrated embodiment. The lens holding member 92 for holding the cylindrical lens 91 is circular and made of a synthetic resin in the illustrated embodiment. This cylindrical lens 91 is embedded in the lens holding member 92 made of a synthetic resin in such a manner that its top surface and bottom surface are exposed. A projecting piece 921 is formed projectingly from one position of the side wall of the lens holding member 92 as shown in FIG. 6.

The above first frame 93 is square with a side length E, and a circular hollow 931 for accepting the above lens holding member 92 and a working chamber 932 for accepting the projecting piece 921 formed on the lens holding member 92 are formed in the top surface of the first frame 93, as shown in FIG. 6. A hole 931b is formed in the center portion of the bottom wall 931a of the circular hollow 931. A recess 932b which is a spring seat is formed in a wall 932a forming the working chamber 932. A screw hole 932c is formed on the axis line of the recess 932b in the first frame 93. The lens holding member 92 is fitted in the circular hollow 931 of the first frame 93 constituted as described above, as shown in FIG. 5, and the projecting piece 921 is housed in the working chamber 932. Therefore, the lens holding member 92 fitted in the circular hollow 931 of the first frame 93 can turn along the side wall (inner peripheral face) of the circular hollow 931 in the range where the projecting piece 921 can move within the working chamber 932. A helical compression spring 95 is interposed between the above recess 932b and the projecting piece 921. A first adjustment screw 96 is screwed into the above screw hole 932c, and the end of the first adjustment screw 96 is designed to be brought into contact with the projecting piece 921. Therefore, when the first adjustment screw 96 is moved forward by turning in one direction, the lens holding member 92 is turned in one direction against the spring force of the helical compression spring 95, and when the first adjustment screw 96 is moved backward by turning in the other direction, the lens holding member 92 is turned in the other direction by the spring force of the helical compression spring 95. Thus, the projecting piece 921 formed on the lens holding member 92, the first adjustment screw 96 and the helical compression spring 95 function as a turning adjustment means for turning the lens holding member 92 along the inner peripheral face of the circular hollow 931.

The above second frame 94 is of a rectangular shape, and a rectangular hollow 941 for accepting the first frame 93 is formed in the top surface of the second frame 94, as shown in FIG. 6. This rectangular hollow 941 has a width A corresponding to the side length E of the above square first frame 93 and a length B larger than the side length E of the first frame 93. The rectangular hollow 941 is sectioned by a bottom wall 942a and side walls 942b, 942c, 942d and 942e. A hole 942f is formed in the center portion of the bottom wall 942a. A recess 942g which is a spring seat is formed in the inner surface of the side wall 942d sectioning the rectangular hollow 941. A screw hole 942h is formed in the side wall 942e opposite to the side wall 942d having the recess 942g. A prolonged hole 942j for accepting the above first adjustment screw 96 is formed in the side wall 942b of the second frame 94. The above first frame 93 is fitted in the rectangular hollow 941 of the second frame 94 constituted as described above, as shown in FIG. 5. A helical compression spring 97 is interposed between the recess 942g formed in the inner surface of the above side wall 942d and the side wall of the first frame 93. A second adjustment screw 98 is screwed into the screw hole 942h formed in the side wall 942e, and the end of the second adjustment screw 98 is brought into contact with the side wall of the first frame 93. Therefore, when the second adjustment screw 98 is moved forward by turning in one direction, the first frame 93 is moved in one direction against the spring force of the helical compression spring 97 and when the second adjustment screw 98 is moved backward by turning in the other direction, the first frame 93 is moved in the other direction by the spring force of the helical compression spring 97. Thus, the second adjustment screw 98 and the helical compression spring 97 function as a moving adjustment means for moving the first frame 93 relative to the second frame 94 in a direction perpendicular to the converging direction of the cylindrical lens 91.

Figure 8:
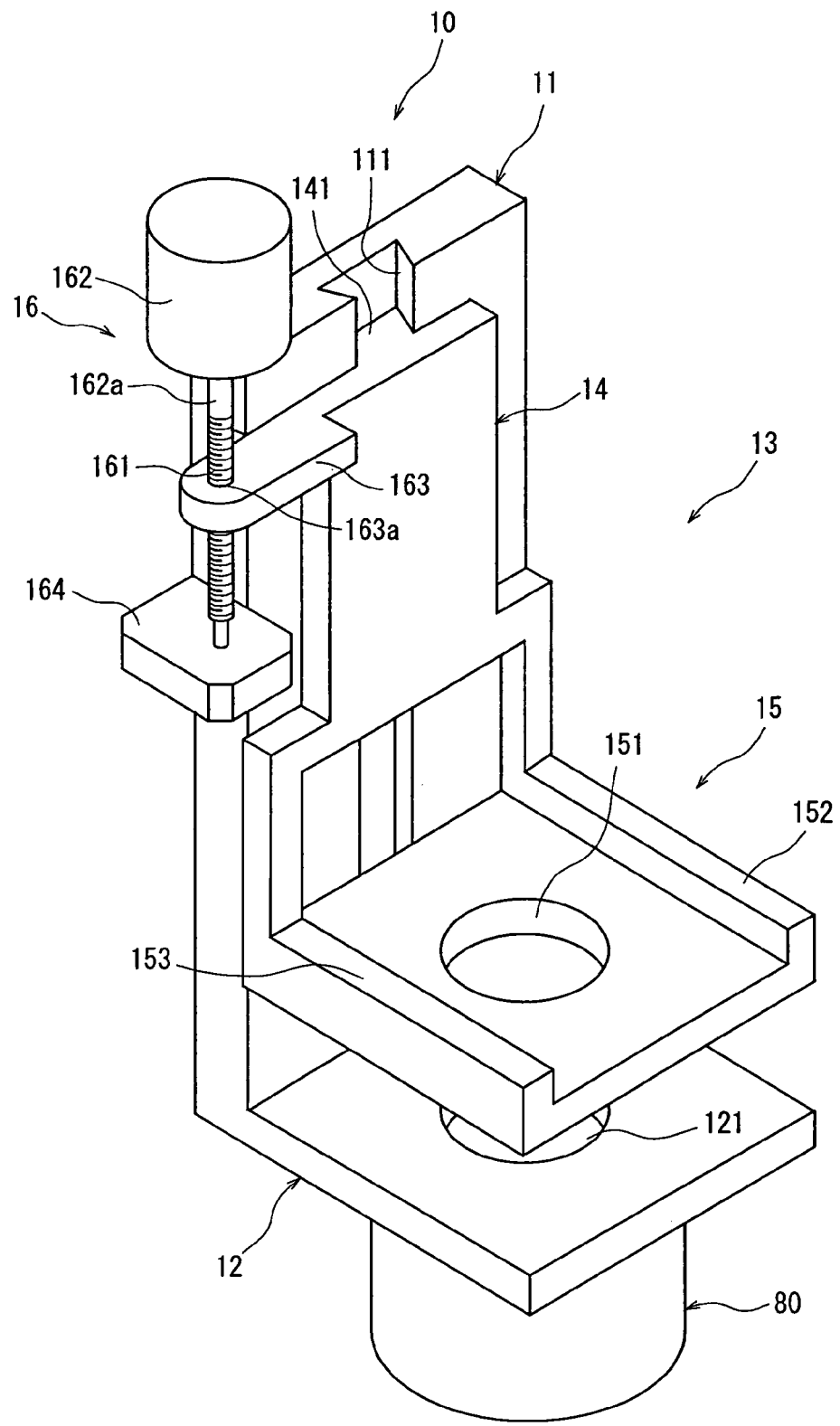
FIG. 8 is a perspective view of an interval adjusting mechanism for adjusting the interval between a condenser lens and the cylindrical lens unit provided in the laser beam processing machine shown in FIG. 1.

The cylindrical lens unit 9 constituted as described above is set in the interval adjustment mechanism 10 shown in FIG. 8. The interval adjustment mechanism 10 will be described hereinbelow.

The interval adjustment mechanism 10 shown in FIG. 8 comprises a support board 11, a condenser lens support plate 12 installed at the lower end of the support board 11, and a support table 13 arranged such that it can move in the vertical direction along the front surface of the support board 11.

A guide groove 111 is formed in the center portion of the front surface of the support board 11 in the vertical direction. The condenser lens support plate 12 projects from the front surface of the support board 11 at a right angle. A hole 121 is formed in the center portion of this condenser lens support plate 12. The lens housing 80 in which the condenser lens 8 is installed is situated at a position corresponding to the hole 121 of the undersurface of the condenser lens support plate 12 constituted as described above.

The above support table 13 is composed of a support portion 14 and a table portion 15 installed at the lower end of the support portion 14. The support portion 14 has, on the back, a to-be-guided rail 141 that is fitted to the guide groove 111 formed in the above support board 11. By fitting this to-be-guided rail 141 to the guide groove 111, the support table 13 is supported to the support board 11 in such a manner that it can move along the guide groove 111 in the vertical direction. The above table portion 15 projects from the front surface of the support portion 14 at a right angle. A hole 151 is formed in the center portion of the table portion 15. Positioning rails 152 and 153 extending at a right angle from the front surface of the support board 11 are formed at both side ends of the table portion 15. The interval between the positioning rails 152 and 153 is set to a size corresponding to the width direction of the second frame 94 constituting the above cylindrical lens unit 9.

The interval adjustment mechanism 10 in the illustrated embodiment has a moving means 16 for moving the support table 13 downward along the guide groove 111 of the support board 11. The moving means 16 comprises a male screw rod 161 arranged in the vertical direction on one side of the support portion 14 of the support table 13 and a pulse motor 162 for rotary-driving the male screw rod 161. The male screw rod 161 is screwed into a threaded screw hole 163a formed in a movable plate 163 fixed to the upper end of the support portion 14, and the lower end of the male screw rod 161 is rotatably supported to a bearing 164 fixed to the side surface of the support board 11. The pulse motor 162 is attached to the support board 11, and its drive shaft 162a is connected to the upper end of the male screw rod 161. Therefore, the support table 13 is moved down by driving the male screw rod 161 in the normal direction with the pulse motor 162 and moved up by driving the male screw rod 161 in the reverse direction. The moving means 16 can suitably adjust the interval between the table portion 15 of the support table 13 and the condenser lens support plate 12 by driving the pulse motor 162 in the normal direction or reverse direction.

Figure 9:
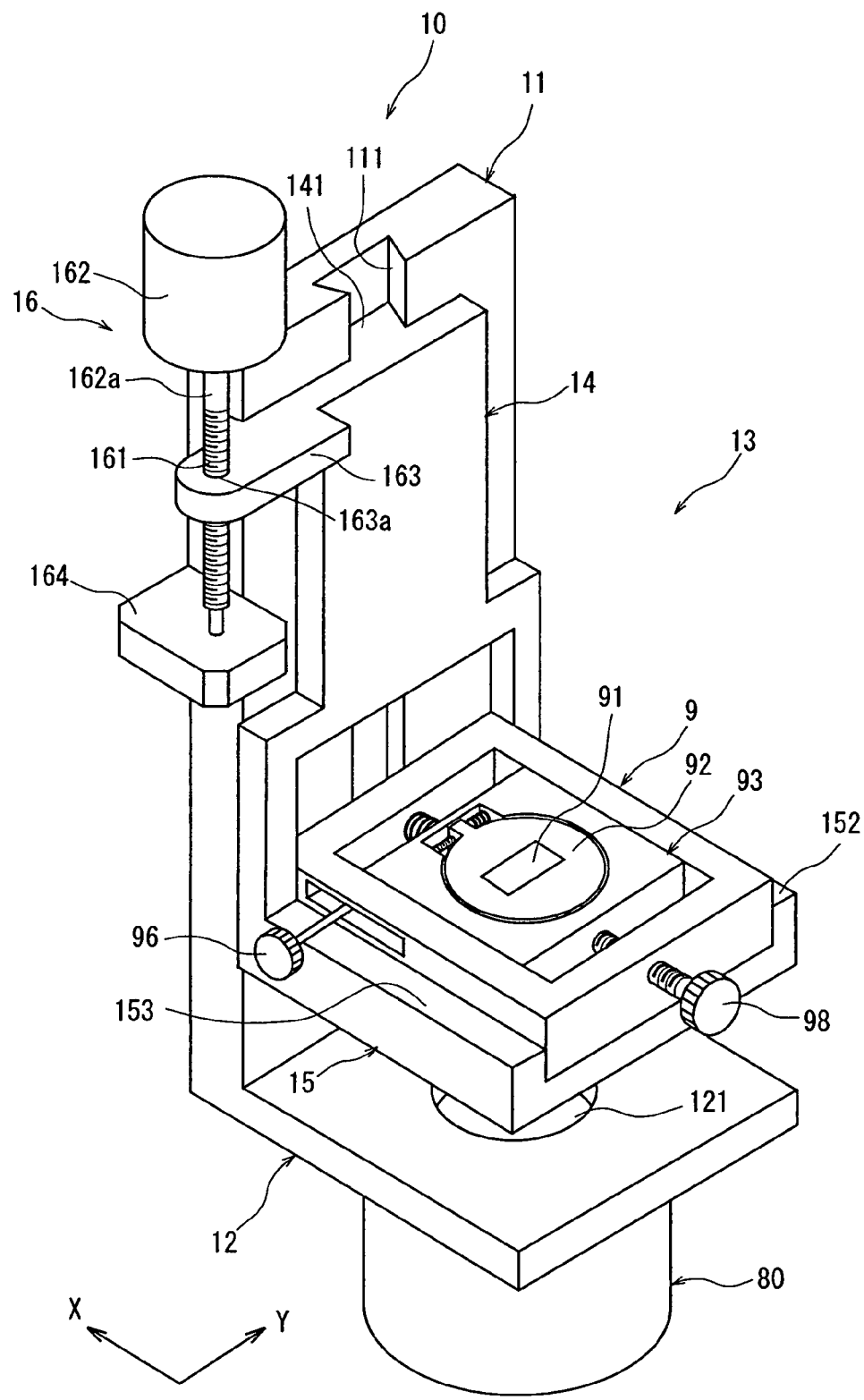
FIG. 9 is a perspective view of the interval adjusting mechanism 8 in which the cylindrical lens unit is set.

The above cylindrical lens unit 9 is set on the table portion 15 of the support table 13 of the interval adjustment mechanism 10 constituted as described above, as shown in FIG. 9. That is, the second frame 94 of the cylindrical lens unit 9 is placed between the positioning rails 152 and 153 of the table portion 15 constituting the support table 13. The cylindrical lens unit 9 placed at a predetermined position on the table portion 15 of the support table 13 is fixed on the table portion 15 of the support table 13 by a suitable fixing means that is not shown. The converging direction of the cylindrical lens 91 of the cylindrical lens unit 9 arranged on the table portion 15 of the support table 13 as described above is set to the processing-feed direction indicated by the arrow X in FIG. 1 and FIG. 9.

Returning to FIG. 1, an image pick-up means 17 for detecting the area to be processed by the above laser beam application means 52 is mounted on the front end portion of the casing 521 constituting the above laser beam application means 52. This image pick-up means 17 is constituted by an image pick-up device (CCD), etc. and supplies an image signal to a control means 100. This control means 100 is composed of a computer, receives an image signal from the above image pick-up means 17 and supplies control signals to the above pulse motor 372, pulse motor 382, pulse motor 432, pulse motor 532, pulse motor 162, and the like.

The laser beam processing machine in the illustrated embodiment is constituted as described above, and its function will be described hereinunder.

The shape of the focal spot of a laser beam applied by the above-described laser beam application means 52 will be described with reference to FIGS. 10(a) to 10(c) and FIGS. 11(a) to 11(c).

Figure 10:
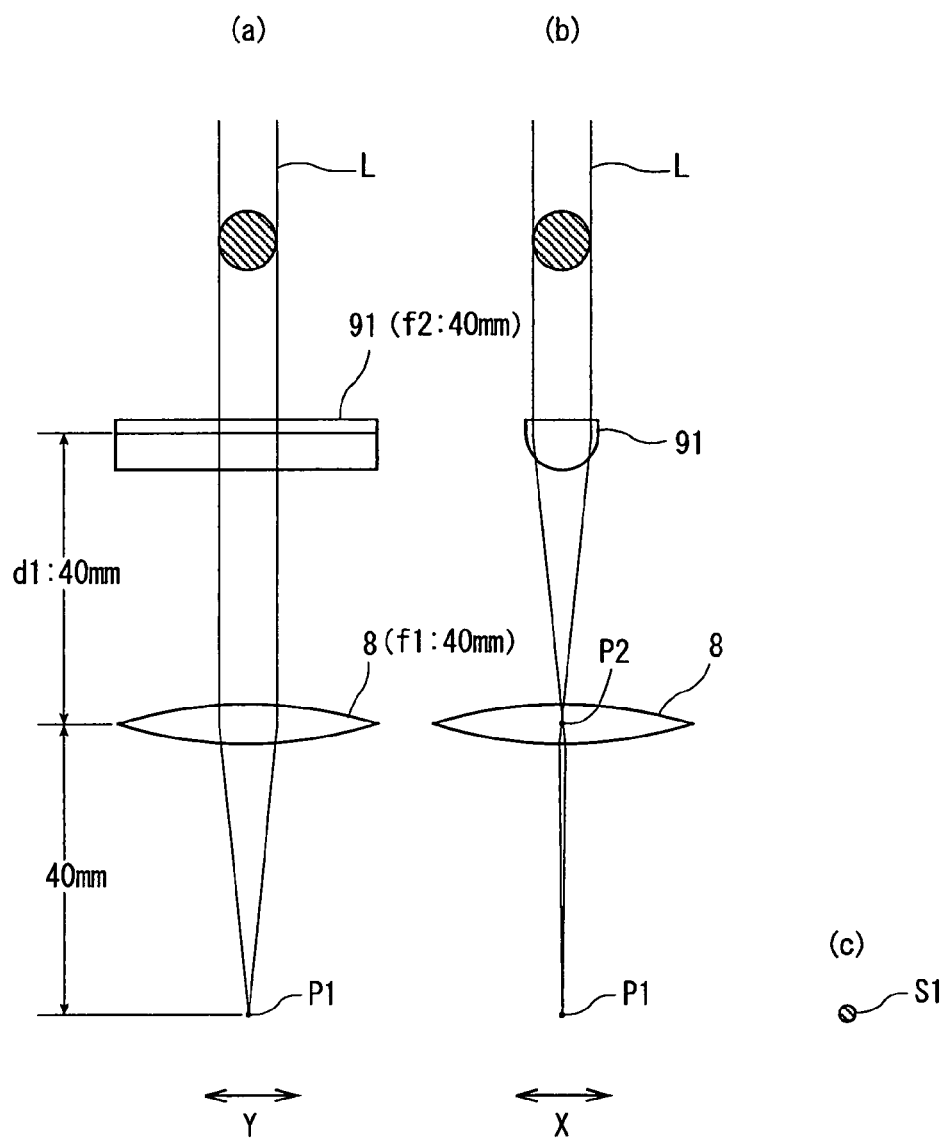
FIGS. 10(a), 10(b) and 10(c) are explanatory diagrams showing states of a focal spot having a circular section being formed by the condenser lens and the cylindrical lens which is a convex lens.

A description is first given of a case where the interval (d1) between the cylindrical lens 91 and the condenser lens 8 is set to 40 mm which is the same as the focal distance (f2) of the cylindrical lens 91, as shown in FIGS. 10(a) and 10(b). In this case, the laser beam L is converged in the Y direction not by the cylindrical lens 91 but only by the condenser lens 8. That is, as shown in FIG. 10(a), the laser beam L passing through the cylindrical lens 91 is focused at a focal point P1 40 mm below the condenser lens 8, which is the focal distance (f1) of the condenser lens 8.

Meanwhile, the laser beam L is converged in the X direction by the cylindrical lens 91. That is, since the focal distance (f2) of the cylindrical lens 91 is set to 40 mm, the focal point P2 of the laser beam L focused in the X direction by the cylindrical lens 91 is at the center position of the condenser lens 8, as shown in FIG. 10(b). The laser beam L focused at the center position of the condenser lens 8 expands toward the undersurface of the condenser lens 8 and is focused again at the above focal point P1 from the undersurface of the condenser lens 8. When the interval (d1) between the cylindrical lens 91 and the condenser lens 8 is made the same as the focal distance (f2) of the cylindrical lens 91, the laser beam L with a circular section entering the cylindrical lens 91 is converged by the cylindrical lens 91 in the X direction and converged by the condenser lens 8 in the Y direction, whereby a focal spot S1 having a circular section shown in the enlarged view of FIG. 10(c) is formed at the focal point P1. Therefore, when the workpiece is placed at the position of the focal point P1, it can be processed by means of the focal spot S1 having a circular section.

Figure 11:
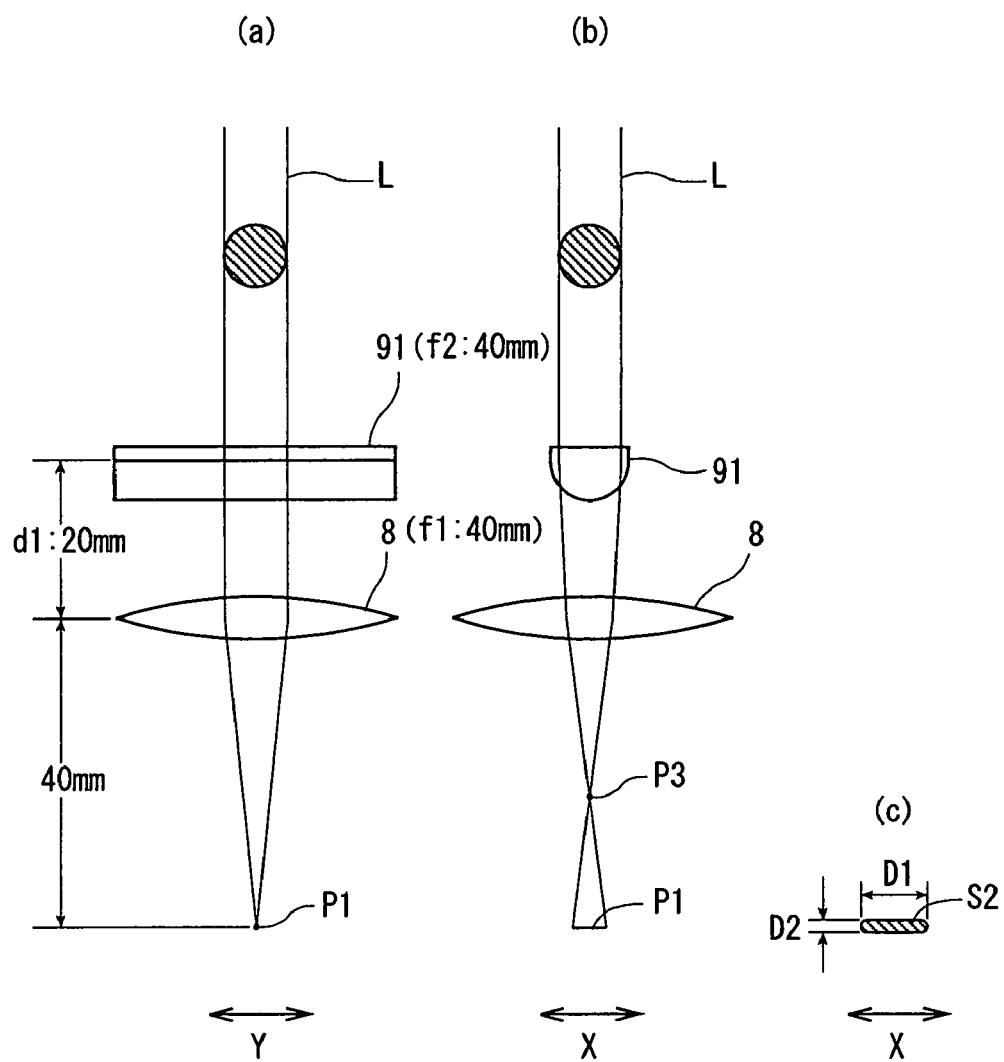
FIGS. 11(a), 11(b) and 11(c) are explanatory diagrams showing states of a focal spot having an elliptic section being formed by the condenser lens and the cylindrical lens which is a convex lens.

A description is next given of a case where the interval (d1) between the cylindrical lens 91 and the condenser lens 8 is set to 20 mm which is half of the focal distance (f2) of the cylindrical lens 91, as shown in FIGS. 11(a) and 11(b). Also in this case, the laser beam L is converged in the Y direction not by the cylindrical lens 91 but only by the condenser lens 8. That is, as shown in FIG. 11(a), the laser beam L passing through the cylindrical lens 91 is focused at the focal point P1 40 mm below the condenser lens 8, which is the focal distance (f1) of the condenser lens 8.

Meanwhile, since the focal distance (f2) of the cylindrical lens 91 is set to 40 mm, the laser beam L which is converged in the X direction by the cylindrical lens 91 as shown in FIG. 11(b) enters the condenser lens 8 before it is focused, is further converged by the condenser lens 8 to be focused at a focal point P3 and then, expanded in the X direction until it reaches the workpiece. As a result, at the position of the focal point P1, a focal spot S2 having an elliptic section is formed as shown in the enlarged view of FIG. 11(c). The long axis D1 of the focal spot S2 having an elliptic section is formed in the direction indicated by the arrow X. The ratio (aspect ratio) of the long axis D1 to the short axis D2 of the elliptic focal spot S2 can be adjusted by changing the interval (d1) between the condenser lens 8 and the cylindrical lens 91. That is, as the interval (d1) between the condenser lens 8 and the cylindrical lens 91 becomes smaller than the focal distance (f2) of the cylindrical lens 91, the ratio (aspect ratio) of the long axis (D1) to the short axis (D2) of the elliptic focal spot S2 becomes larger. Therefore, when the workpiece is placed at the position of the focal point P1, it can be processed by means of the focal spot S2 having an elliptic section.

A description is subsequently given of a processing method for forming a groove in the workpiece by means of the focal spot S2 having an elliptic section shown in FIG. 11(c).

Figure 12:
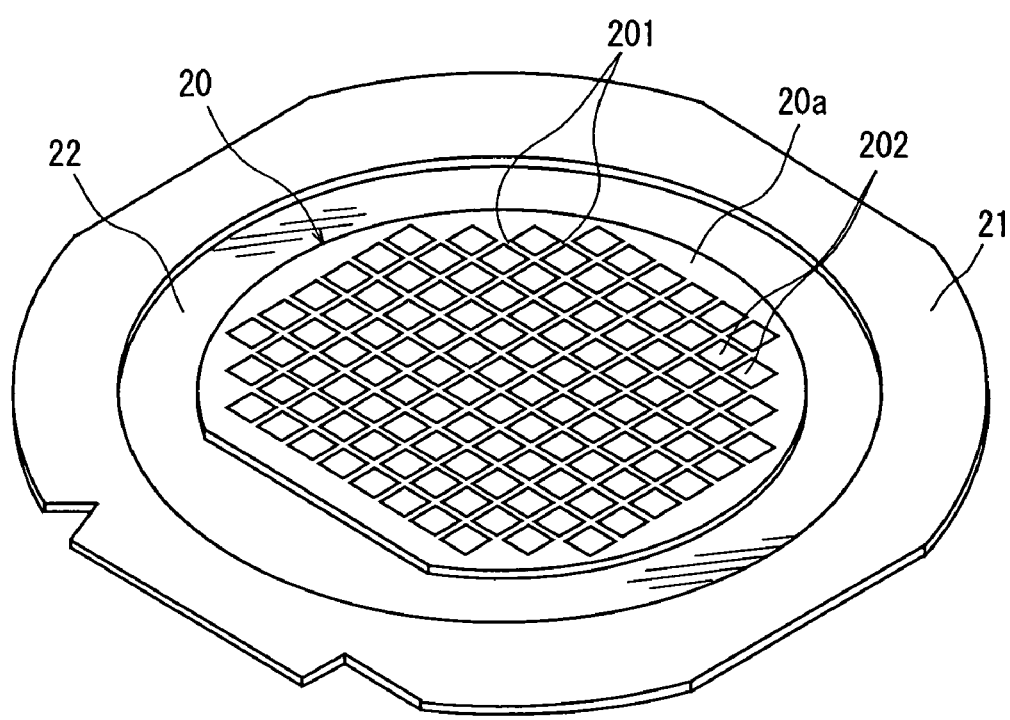
FIG. 12 is a perspective view of an optical device wafer as a workpiece which is put on the surface of a protective tape mounted on an annular frame.

An optical device wafer as the workpiece to be processed by the above laser beam processing machine 1 will be described with reference to FIG. 12. The optical device wafer 20 shown in FIG. 12 is a silicon carbide (SiC) wafer, a plurality of areas are sectioned by a plurality of streets 201 formed in a lattice pattern on the front surface 20a, and an optical device 202 such as a photodiode or laser diode is formed in each of the sectioned areas. The rear side of this optical device wafer 20 is put on a protective tape 22 which is a synthetic resin sheet made of polyolefin or the like and is mounted on an annular frame 21 in such a manner that the front surface 20a faces up.

To form a groove along the streets 201 of the above-described optical device wafer 20 by using the laser beam processing machine 1 shown in FIG. 1, the optical device wafer 20 is first placed on the chuck table 36 of the laser beam processing machine 1 in such a manner that the front surface 20a faces up. The optical device wafer 20 is suction-held on the chuck table 36 through the protective tape 22 by activating a suction means that is not shown. The annular frame 21, on which the protective tape 22 is mounted, is fixed by the clamps 362 provided on the chuck table 36. The chuck table 36 suction-holding the optical device wafer 20 is brought to a position right below the image pick-up means 17 by the processing-feed means 37. After the chuck table 36 is positioned right below the image pick-up means 17, alignment work for detecting the area to be processed of the optical device wafer 20 is carried out by the image pick-up means 17 and the control means 100. That is, the image pick-up means 17 and the control means 100 carry out image processing such as pattern matching, etc. to align a street 201 formed in a predetermined direction of the optical device wafer 20 with the condenser 7 of the laser beam application means 52 for applying a laser beam along the street 201, thereby performing the alignment of a laser beam application position. The alignment of the laser beam application position is also carried out on streets 201 formed on the optical device wafer 20 in a direction perpendicular to the above predetermined direction.

After the alignment of the laser beam application position is carried out by detecting the street 201 formed on the optical device wafer 20 held on the chuck table 36 as described above, as shown in FIG. 13(a), the chuck table 36 is moved to a laser beam application area where the condenser 7 of the laser beam application means 52 is located so as to bring one end (left end in FIG. 13(a)) of the predetermined street 201 to a position right below the condenser 7. The long axis D1 shown in FIG. 11(c) of the focal spot S2 having an elliptic section of the laser beam applied from the condenser 7 is positioned along the street 201.

Figure 13:
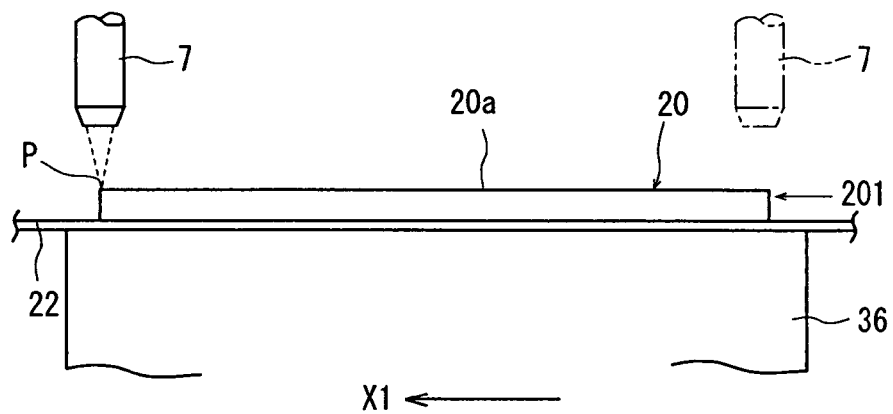
FIGS. 13(a), 13(b) and 13(c) are explanatory diagrams showing a groove forming step in the wafer laser processing method of the present invention which is carried out with the laser beam processing machine shown in FIG. 1.
Figure 13:
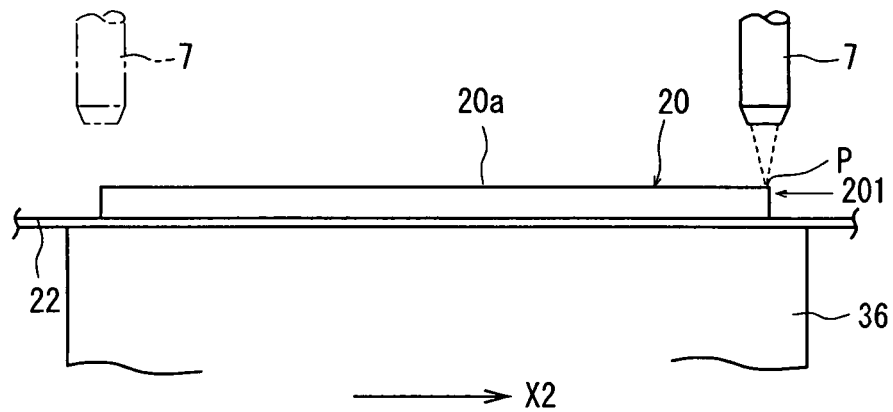
Figure 13:
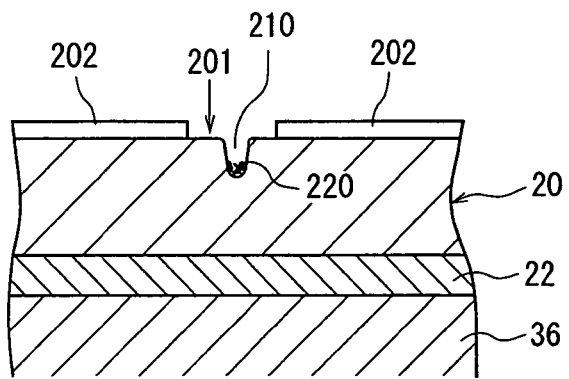

Next comes the step of forming a groove along the streets 201 by applying a first laser beam whose elliptic focal spot has a ratio (aspect ratio) of the long axis to the short axis of 30 to 60:1, along the streets formed on the wafer. It is important that the ratio (aspect ratio) of the long axis to the short axis of the elliptic focal spot of the first laser beam should be set to 30 to 60:1 suitable for the formation of a groove in this groove forming step. As for the adjustment of the aspect ratio of the elliptic focal spot, the pulse motor 162 of the above interval adjustment mechanism 10 is controlled to achieve the above aspect ratio set by the control means 100. The focal point P1 of the pulse laser beam applied from the condenser 7 is set to a position near the front surface 20a (top surface) of the optical device wafer 20. The moving means 53 for moving the laser beam application means 52 along the guide rails 423 and 423 in the direction indicated by the arrow Z is used to set the focal point P1 to the position near the front surface 20a (top surface) of the optical device wafer 20. The chuck table 36 is then moved in the direction indicated by the arrow X1 in FIG. 13(a) at a predetermined processing-feed rate while a pulse laser beam of a wavelength (200 to 600 nm) having absorptivity for the optical device wafer 20 is applied from the condenser 7 of the laser beam application means 52. When the other end (right end in FIG. 13(a)) of the street 201 reaches a position right below the condenser 7, the application of the pulse laser beam is suspended, and the movement of the chuck table 36 is stopped. Thereafter, the chuck table 36 is moved in the direction indicated by the arrow X2 in FIG. 13(b) at a predetermined processing-feed rate while a pulse laser beam is applied from the condenser 7 of the laser beam application means 52 as shown in FIG. 13(b). When the other end (left end in FIG. 13(b)) of the street 201 reaches a position right below the condenser 7, the application of the pulse laser beam is suspended, and the movement of the chuck table 36 is stopped. A groove 210 is formed along the street 201 in the optical device wafer 20 as shown in FIG. 13(c) by carrying out this groove forming step a plurality of times (for example, 5 round-trips). Debris 220 formed by the application of the pulse laser beam accumulates in the groove 210.

The above groove forming step is carried out under the following processing conditions, for example.
 Light source of laser beam: YVO4 laser or YAG laser
 Wavelength: 355 nm
 Repetition frequency: 10 kHz
 Average output: 7 W
 Focal spot: elliptic, long axis (D1) of 500 μm, short axis (D2) of 10 μm
 Processing-feed rate: 50 mm/sec Since in the above groove forming step, the long axis (D1) of the elliptic focal spot of the first laser beam is set to 500 μm and the aspect ratio is set to 50:1, the overlapping rate of the focal spot becomes large, thereby enhancing the groove processing effect. By carrying out the groove forming step a plurality of times as described above, the groove 210 is formed along the street 201 in the optical device wafer 20 and the debris 220 accumulates in the groove 210 at the same time. It has been found that when the debris 220 accumulates in the groove 210, the laser beam is blocked by the debris 220 to make it impossible to deepen the groove, even though the above groove forming step is repeatedly carried out.

Figure 14:
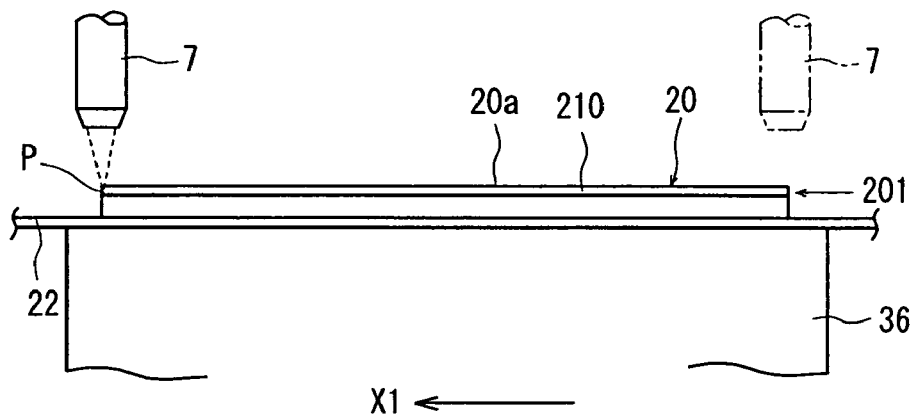
FIGS. 14(a), 14(b) and 14(c) are explanatory diagrams showing a debris removing step in the wafer laser processing method of the present invention which is carried out with the laser beam processing machine shown in FIG. 1.
Figure 14:
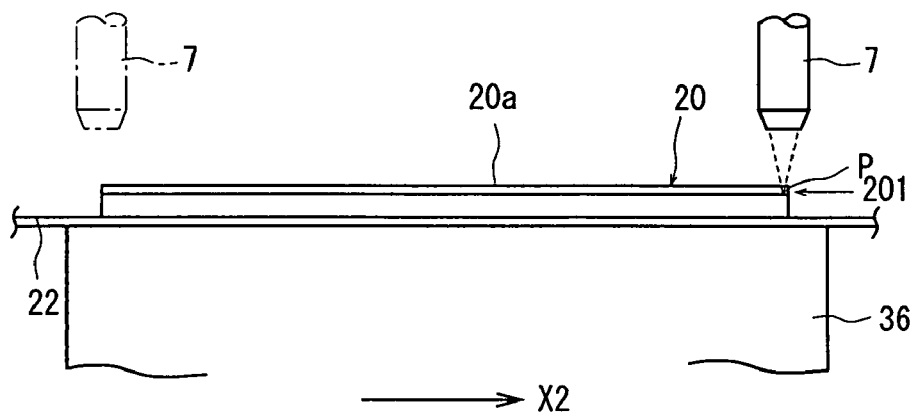
Figure 14:
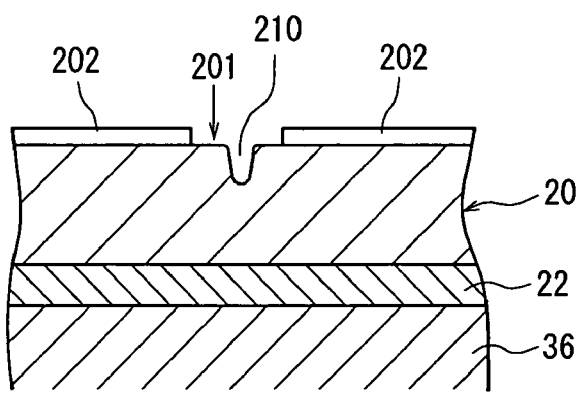

In the present invention, the above groove forming step is followed by the step of removing the debris 220 accumulated in the groove 210. In this debris removing step, it is important that a second laser beam whose elliptic focal spot has an aspect ratio of 1 to 20:1 which is suitable for removing debris should be used. As for the adjustment of the aspect ratio of the elliptic focal spot, the pulse motor 162 of the above interval adjustment mechanism 10 is so controlled as to achieve the above aspect ratio set by the control means 100. Then, one end (left end in FIG. 14(a)) of the above groove 210 (street 201) is brought to a position right above the condenser 7 as shown in FIG. 14(a). The long axis of the focal spot having an elliptic section of the laser beam applied from the condenser 7 is positioned along the groove 210 (street 201). The focal point P1 of the pulse laser beam applied from the condenser 7 is then set to a position near the bottom of the groove 210. The moving means 53 for moving the laser beam application means 52 along the guide rails 423 and 423 in the direction indicated by the arrow Z is used to set the focal point P1 to the position near the bottom of the groove 210.

The chuck table 36 is then moved in the direction indicated by the arrow X1 in FIG. 14(a) at a predetermined processing-feed rate while the pulse laser beam is applied from the condenser 7 of the laser beam application means 52. When the other end (right end in FIG. 14(a)) of the groove 210 (street 201) reaches a position right below the condenser 7, the application of the pulse laser beam is suspended, and the movement of the chuck table 36 is stopped. Thereafter, the chuck table 36 is moved in the direction indicated by the arrow X2 in FIG. 14(b) at a predetermined processing-feed rate while a pulse laser beam is applied from the condenser 7 of the laser beam application means 52, as shown in FIG. 14(b). When the other end (left end in FIG. 14(b)) of the groove 210 (street 201) reaches a position right below the condenser 7, the application of the pulse laser beam is suspended, and the movement of the chuck table 36 is stopped. By carrying out this debris removing step a plurality of times (for example, 5 round-trips), the debris 220 accumulated in the groove 210 in the above groove forming step is burned and scattered to be removed and consequentry, the groove 210 is formed deep in the optical device wafer 20, as shown in FIG. 14(c).

The above debris removing step is carried out under the following processing conditions, for example.

Light source of laser beam: YVO4 laser or YAG laser
Wavelength: 355 nm
Repetition frequency: 10 kHz
Average output: 7 W
Focal spot: elliptic, long axis (D1) of 100 μm, short axis (D2) of 10 μm
Processing-feed rate: 100 mm/sec In the above debris removing step, as the aspect ratio of the long axis (D1) to the short axis (D2) of the elliptic focal spot of the second laser beam is set to 10:1 which is smaller than the aspect ratio of the long axis (D1) to the short axis (D2) of the focal spot in the above groove forming step and the area of the focal spot becomes small, the power density of the irradiated laser beam becomes high, whereby the debris 220 accumulated in the groove 210 in the above groove forming step is burned and scattered to be removed. By repeating the above groove forming step and the above debris removing step, the optical device wafer 20 can be cut along the streets 201.

According to experiments conducted by the inventors of the present invention, when the above groove forming step and the debris removing step were carried out 3 times on a silicon carbide (SiC) wafer having a thickness of 350 μm, the silicon carbide (SiC) wafer could be cut along the predetermined streets.

What is claimed is:

1. A wafer laser processing method for forming a groove along streets in a wafer by moving the wafer at a predetermined processing-feed rate while a laser beam whose focal spot is elliptic is applied along the streets formed on the wafer, comprising:

a groove forming step for forming a groove along the streets by applying a first laser beam whose elliptic focal spot has a ratio of the long axis to the short axis of 30 to 60:1, along the streets formed on the wafer; and a debris removing step for removing debris accumulated in the groove by applying a second laser beam whose elliptic focal spot has a ratio of the long axis to the short axis of 1 to 20:1, along the groove formed by the groove forming step;

the groove forming step and the debris removing step being repeated alternately.

2. The wafer laser processing method according to claim 1, wherein the long axis of the elliptic focal spot of the first laser beam is set to 300 to 600 μm, and the long axis of the elliptic focal spot of the second laser beam is set to 10 to 200 μm.

* * * * *